US008947632B2

(12) United States Patent
Staals et al.

(10) Patent No.: US 8,947,632 B2
(45) Date of Patent: Feb. 3, 2015

(54) LITHOGRAPHIC APPARATUS, DEVICE MANUFACTURING METHOD, AND METHOD OF APPLYING A PATTERN TO A SUBSTRATE

(75) Inventors: Frank Staals, Eindhoven (NL); Marcus Adrianus Van De Kerkhof, Helmond (NL)

(73) Assignee: ASML Netherlands B.V., Veldhoven (NL)

(*) Notice: Subject to any disclaimer, the term of this patent is extended or adjusted under 35 U.S.C. 154(b) by 473 days.

(21) Appl. No.: 12/969,326

(22) Filed: Dec. 15, 2010

(65) Prior Publication Data

US 2011/0164229 A1 Jul. 7, 2011

Related U.S. Application Data

(60) Provisional application No. 61/289,855, filed on Dec. 23, 2009.

(51) Int. Cl.
*G03B 27/52* (2006.01)
*G03B 27/68* (2006.01)
*G03F 9/00* (2006.01)

(52) U.S. Cl.
CPC ............ *G03F 9/7003* (2013.01); *G03F 9/7034* (2013.01)
USPC ............................................... 355/55; 355/52

(58) Field of Classification Search
USPC .................................. 355/53, 55, 52; 356/608
See application file for complete search history.

(56) References Cited

U.S. PATENT DOCUMENTS

| 5,013,108 A | 5/1991 | Van Amstel |
| 5,191,200 A | 3/1993 | Van Der Werf |
| 5,448,332 A | 9/1995 | Sakakibara et al. |
| 5,510,892 A * | 4/1996 | Mizutani et al. ............ 356/139.1 |
| 5,602,399 A * | 2/1997 | Mizutani ........................ 250/548 |
| 5,602,400 A * | 2/1997 | Kawashima ................... 250/548 |

(Continued)

FOREIGN PATENT DOCUMENTS

| JP | 07-130635 | 5/1995 |
| JP | 7-192987 A | 7/1995 |

(Continued)

OTHER PUBLICATIONS

Japanese Office Action mailed Aug. 21, 2012 in corresponding Japanese Patent Application No. 2010-281884.

*Primary Examiner* — Peter B Kim
*Assistant Examiner* — Deoram Persaud
(74) *Attorney, Agent, or Firm* — Pillsbury Winthrop Shaw Pittman LLP

(57) ABSTRACT

A lithographic apparatus includes a patterning subsystem for transferring a pattern from a patterning device onto a substrate controlled in accordance with recorded measurements of level variations across a surface of the substrate. A level sensor is provided for projecting a level sensing beam of radiation to reflect from a location on the substrate surface and for detecting the reflected sensing beam to record the surface level at said location. The level sensor incorporates at least one moving optical element to scan the substrate surface by optical movement in at least one dimension to obtain measurements of surface level at different locations without mechanical movement between the level sensor and the substrate. Optical path length equalization measures may be employed, using shaped reflectors and/or additional moving mirrors, to avoid focus variation during the scan.

12 Claims, 10 Drawing Sheets

(56) References Cited

U.S. PATENT DOCUMENTS

| | | | |
|---|---|---|---|
| 5,661,548 A * | 8/1997 | Imai | 355/55 |
| 5,729,337 A * | 3/1998 | Tanaka | 356/139.1 |
| 6,040,909 A * | 3/2000 | Hasegawa et al. | 356/614 |
| 6,084,716 A | 7/2000 | Sanada et al. | |
| 6,674,510 B1 * | 1/2004 | Jasper et al. | 355/55 |
| 7,166,855 B2 * | 1/2007 | Yamada et al. | 250/559.29 |
| 7,982,884 B2 * | 7/2011 | Smith | 356/622 |
| 2002/0018191 A1 * | 2/2002 | Suzuki | 355/53 |
| 2009/0000973 A1 | 1/2009 | Carley | |
| 2009/0009738 A1 * | 1/2009 | Sasaki | 355/53 |
| 2010/0245829 A1 * | 9/2010 | Goodwin et al. | 356/445 |
| 2012/0194792 A1 * | 8/2012 | Sapp et al. | 355/55 |

FOREIGN PATENT DOCUMENTS

| | | |
|---|---|---|
| JP | 08-145645 | 6/1996 |
| JP | 10-284393 | 10/1998 |
| JP | 11-135411 A1 | 5/1999 |
| JP | 2002-196222 | 7/2002 |
| JP | 2003-203838 A | 7/2003 |
| JP | 2004-241744 A | 8/2004 |
| JP | 2007-48818 A | 2/2007 |
| JP | 2007-192685 A | 8/2007 |
| WO | 2009/093594 | 7/2009 |

* cited by examiner

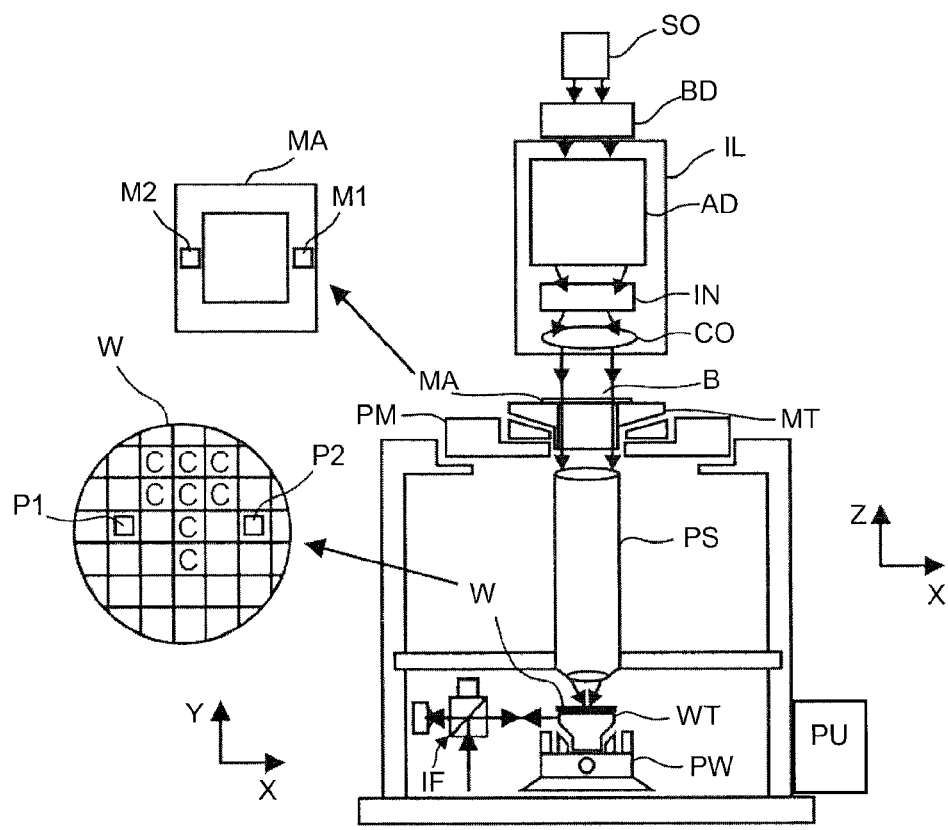
Fig. 1
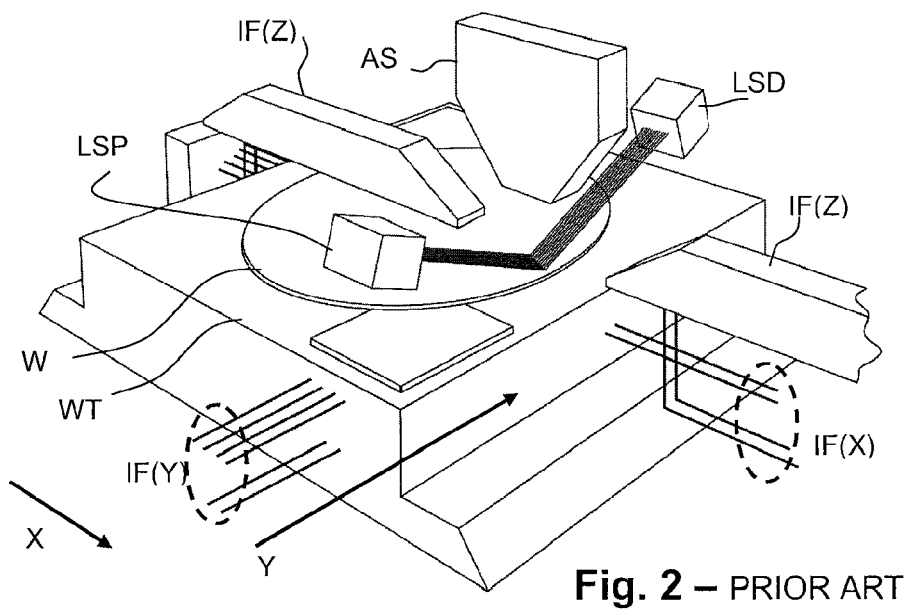
Fig. 2 – PRIOR ART

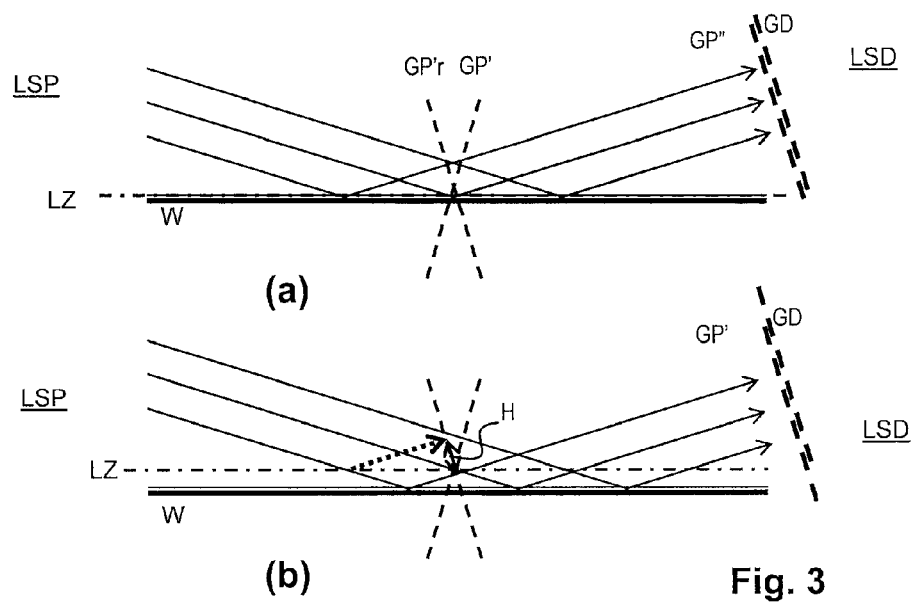
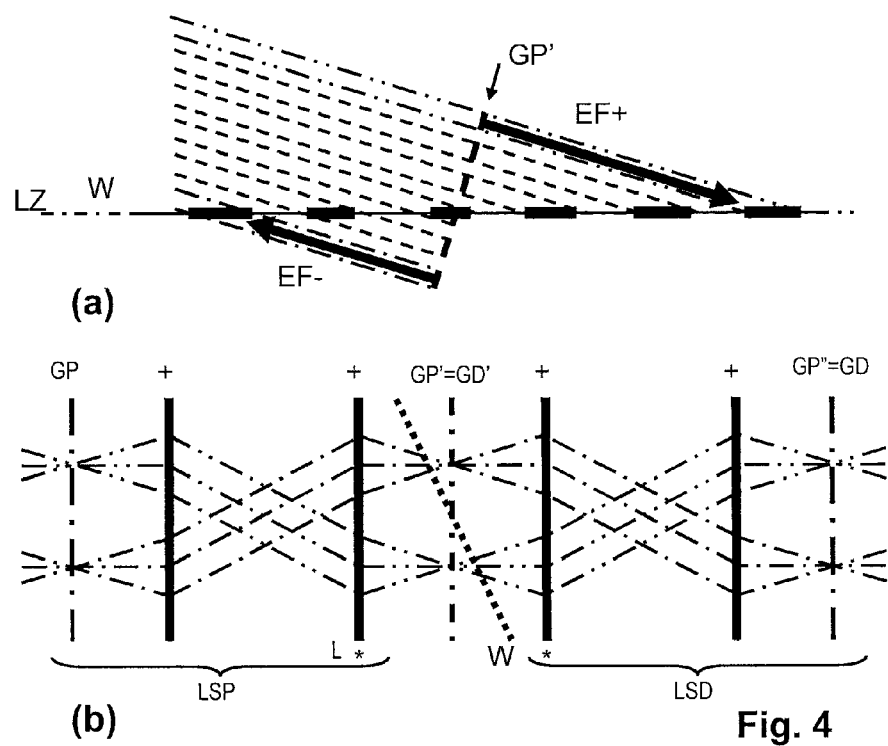
Fig. 3
Fig. 4

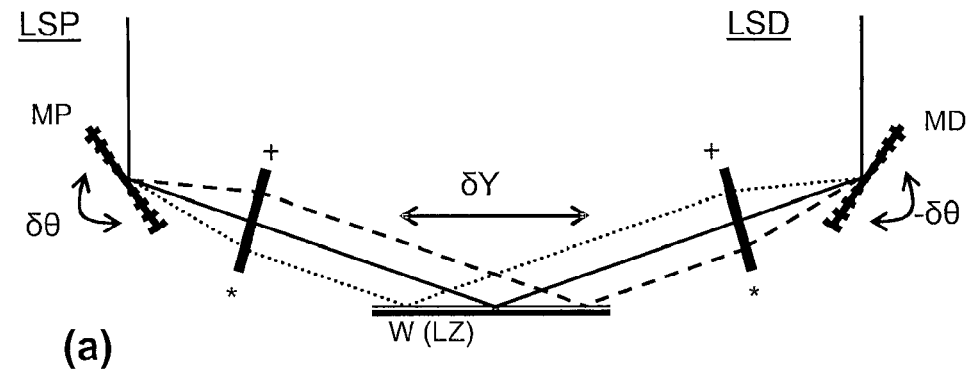
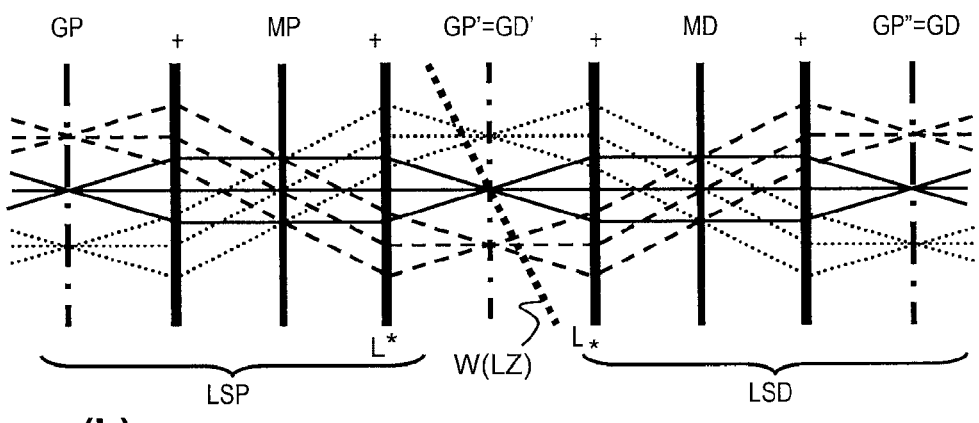
Fig. 5
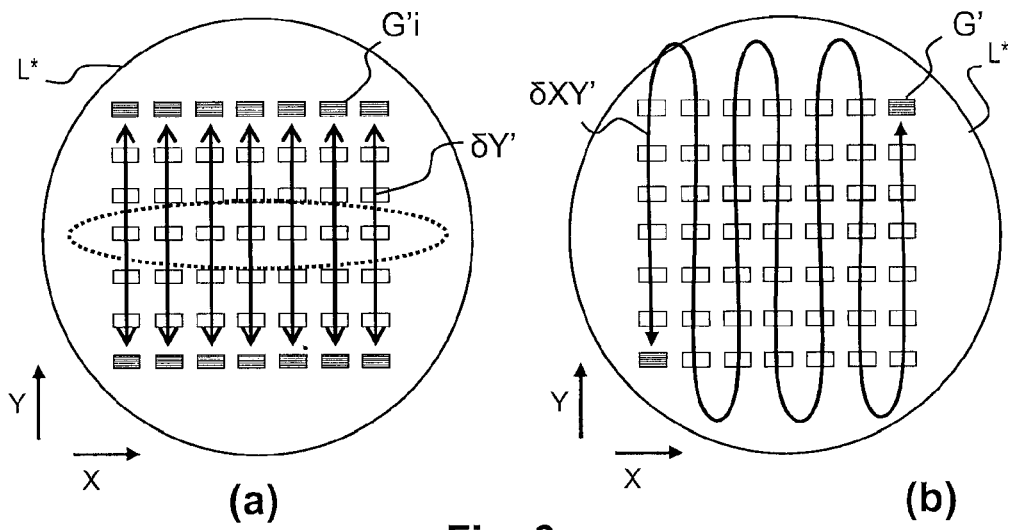
Fig. 6

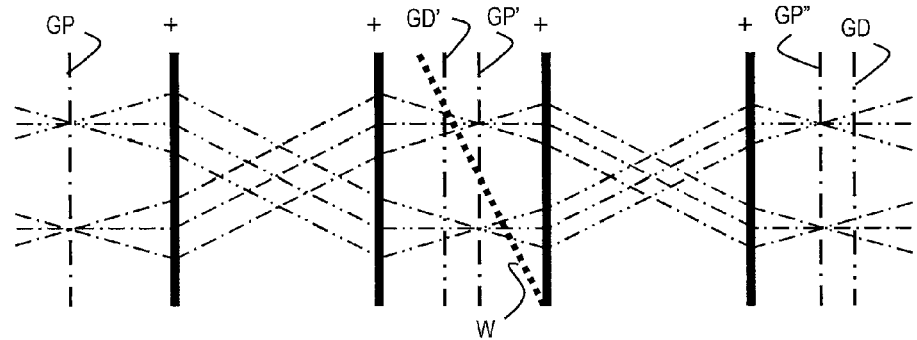
Fig. 14
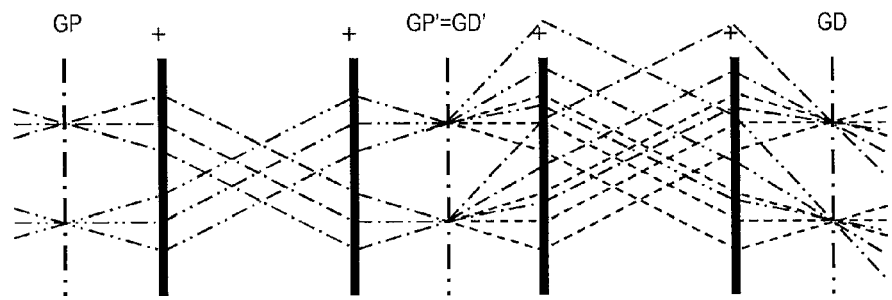
(a)
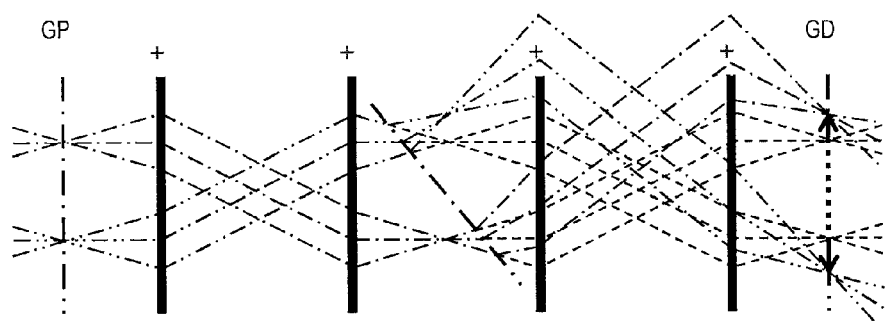
(b)
Fig. 15

LITHOGRAPHIC APPARATUS, DEVICE MANUFACTURING METHOD, AND METHOD OF APPLYING A PATTERN TO A SUBSTRATE

This application claims priority and benefit under 35 U.S.C. §119(e) to U.S. Provisional Patent Application No. 61/289,855, entitled "Lithographic Apparatus, Device Manufacturing Method, and Method Of Applying A Pattern To A Substrate," filed on Dec. 23, 2009. The content of that application is incorporated herein in its entirety by reference.

FIELD

The present invention relates to a lithographic apparatus and a method for manufacturing a device. The invention relates in particular to methods and devices for measuring surface level variations across a substrate, prior to applying a pattern from a patterning device onto a substrate, though the invention may also be applied for measuring surface level variations on other types of target for other purposes. The invention further relates to a computer program product for controlling a lithographic apparatus to implement steps of such methods.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

An important step in the lithographic process is the measurement of the target substrate, to ensure high contrast patterning and proper alignment with previously applied patterned features. The level (height) of the surface across a substrate, though it may be in everyday terms extremely flat, typically varies from place to place sufficiently to disturb the quality of the applied pattern if not corrected. In the example of patterning by optical projection, for example, level variations will disturb the focusing of the projected pattern, and hence the contrast between exposed and unexposed parts of the resist. Accordingly, high-performance lithographic apparatuses conventionally include level sensors for 'mapping' variations in surface level across the substrate as precisely as possible, prior to applying the pattern. Typically this mapping is performed for the entire substrate in a measurement step, but in principle it may be performed after applying the pattern to a first portion of the substrate.

In one known lithographic apparatus, a level sensor projects a line array of sensing spots onto the substrate at an oblique angle, these being reflected and detected by a photodetector. Each spot includes features such as a grating pattern, which can be compared with a corresponding pattern at the detector side to detect very fine height variations in the target surface. In the known apparatus, the substrate is moved beneath the level sensor in a two-dimensional sweeping pattern, to measure and map level variations across the entire surface. This sweeping movement takes time in the measuring step, which inevitably limits the throughput of the apparatus (wafers per hour). U.S. Pat. No. 5,191,200 (van der Werf et al/Philips) describes examples of level sensing apparatus suitable for use in such an apparatus. The contents of U.S. Pat. No. 5,191,200 are hereby incorporated herein by reference.

SUMMARY

The invention in a first aspect provides a lithographic apparatus comprising a patterning subsystem for transferring a pattern from a patterning device onto a substrate, the patterning subsystem being controlled in accordance with measurements of level variations across a surface of the substrate. A level sensor is provided for projecting a level sensing beam of radiation to reflect from a location on the substrate surface and for detecting the reflected sensing beam to measure the surface level at said location. In a particular embodiment, the substrate, or at least a portion thereof, is measured and the measurements recorded in advance of patterning. The level sensor incorporates at least one moving optical element whereby said sensing beam scans the substrate surface optically in at least one dimension to obtain measurements of the surface level at different locations without corresponding mechanical movement between the level sensor and the substrate. By employing optical scanning in place of mechanical movements in at least one dimension, delay in the level mapping process can be reduced, for a given accuracy of measurement. Throughput of the lithographic apparatus can be increased, or the saved time can be devoted to improving patterning performance in parameters such as overlay. Mechanical movement of relatively minor extent in the scanning dimension, as well as mechanical movement in other dimensions, are not excluded. Indeed, movements perpendicular to the substrate surface for focusing, and movements for scanning the surface in a dimension direction substantially perpendicular to the scanning dimension, are features of certain embodiments.

In some embodiments of the invention, more than one moving optical element may be provided, movements of these elements being synchronized with one another during the scanning. For example, complementary moving elements may be provided at projection and detection sides of the level sensing apparatus. Two moving optical elements may be deployed at the same side of the apparatus, to combine steering the sensing beam with path length equalization. Further details of such embodiments will be described in the examples below.

The invention further provides a device manufacturing method employing a lithographic apparatus according to the first aspect of the invention as set forth above, the method comprising the steps: loading a patterning device and a substrate into the apparatus; measuring surface level variations across the substrate using said level sensor; transferring the pattern one or more times from the patterning device to the substrate, controlling said transferring step by reference to the measured surface level variations; and processing the patterned substrate to produce functional device features.

The invention further provides a method of measuring level variations across a surface of substrate in a lithographic apparatus, the method comprising:

(a) providing a level sensing optical system in the lithographic apparatus;

(b) using said optical system to project a level sensing beam of radiation to reflect from a location on the substrate surface; and (c) detecting the reflected sensing beam to record the surface level at said location, wherein the optical system employs at least one moving optical element whereby in step (b) said sensing beam scans different locations across the substrate surface by optical movement in at least one dimension, and in step (c) the detecting step obtains respective measurements of surface level at said different locations without corresponding mechanical movement between said level sensing optical system and the substrate.

While the level sensor apparatus and methods of the invention will be described in applications for lithography, it may be applied in other fields where a rapid but accurate mapping of surface level across a target is required. Rather than being limited to the process of metrology as a preliminary to lithography, the methods and apparatus described can be applied in a metrology apparatus. The level mapping step may be performed for its own sake, or as a preliminary to a more accurate measurement by a sensor following the delivered height map. Height mapping may be performed for quality control of optical components, for example, and even as a preliminary to processing steps such as grinding or polishing. The applicant reserves the right to claim the level sensor apparatus and methods independently of lithographic apparatus.

These and other features and advantages of the invention will be understood by the skilled reader from a consideration of the exemplary embodiments discussed below.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 1 depicts a lithographic apparatus according to an embodiment of the invention;

FIG. 2 shows a measurement apparatus in the lithography apparatus of FIG. 1 according to a prior art example;

FIG. 3 illustrates a triangulation principle in the operation of a level sensor in the apparatus of FIG. 2 that may be applied in embodiments of the present invention;

FIG. 4 illustrates in more detail the imaging of a level sensing spot grating on a target and through the optical system of the level sensor of FIG. 3;

FIG. 5 illustrates the general principle of operation of a novel, scanning type level sensor according to a first embodiment of the invention;

FIG. 6 illustrates the path of a grating spot array through an objective lens element of the level sensor, in embodiments with (a) 1-D and (b) 2-D scanning;

FIG. 14 illustrates the effects of poor focus in the level sensors of FIGS. 5-13;

FIG. 15 illustrates the effect of local tilting of the target surface (a) on the scale of individual grating bars and (b) on the scale of an individual grating spot;

DETAILED DESCRIPTION OF EXEMPLARY EMBODIMENTS

Figure 7:
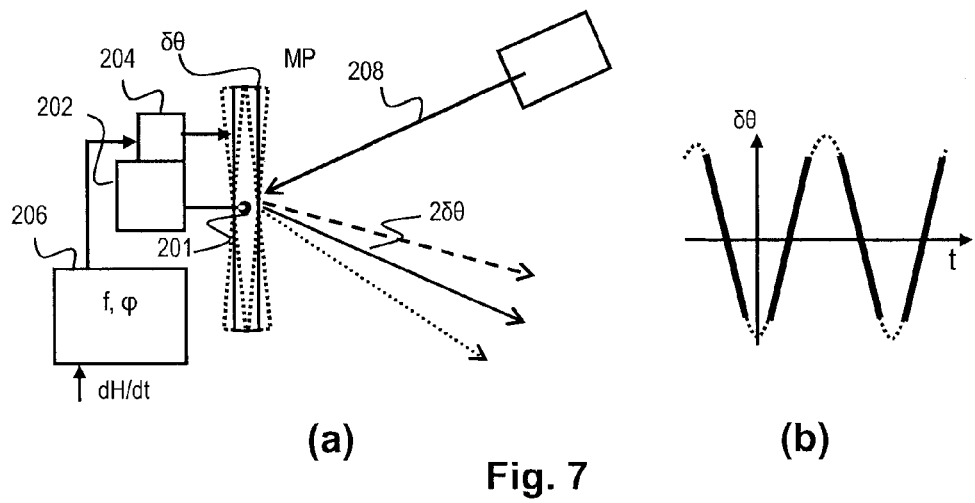
FIG. 7 illustrates schematically the actuator and control mechanisms of a moving optical element in the embodiment of FIGS. 5 and 6.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The apparatus further includes a processing unit PU which controls all the movements and measurements of the various actuators and sensors described.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The invention disclosed herein provides additional flexibility in both single- and multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

In practice, processing unit PU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to readout of the position sensor IF. Overall control of the apparatus may be controlled by a central processing unit, communicating with these sub-systems processing units, with operators and with other apparatuses involved in the lithographic manufacturing process.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed. The following examples and description assume a scanning mode of operation, but this is not directly relevant to the invention. By convention, each target portion C on the substrate can be referred to as a field. The scanning motion during exposure of one field defines the Y direction, while steps between fields or columns of fields define the X direction.

FIG. 2 is a perspective view of level mapping operations taking place in a known lithographic apparatus. Substrate table WT is shown with a substrate W loaded thereon which is being measured by a level sensor comprising a level sensing projector LSP and a level sensing detector LSD. An alignment sensor AS is provided for measuring X-Y position across the substrate. Position sensor IF, seen in FIG. 1, is seen in more detail in FIG. 2. A pair of Z-direction position sensors IF(Z) are provided (in this example, interferometers), while IF(X) represents rays of the X-direction interferometer, and IF(Y) represents rays of the Y-direction interferometer. As mentioned previously, other forms of position sensor may be used, for example, encoder plates, as is known to the skilled person.

In operation of the known level sensor, a number of level sensing "spots" are projected onto a line-shaped portion of the substrate surface, by projector LSP, and reflected from the substrate surface to be imaged in the level sensing detector LSD. Each spot may comprise a pattern of lines created by an array of slits in the projector. This array of slits will be referred to as a 'grating' for simplicity. The array of slits are spaced much more widely than a wavelength of the sensing radiation, so the term 'grating' is not used here in the sense of a diffraction grating. In principle, a simple spot could be used, but the use of multiple lines, increasing the number of edges in the dimension to be sensed, improves measurement performance. The spot in this example is shaped in the projected beam so as to cover a roughly square patch on the substrate W. The patch may be, for example, 2-3 mm square, the size and shape of the spot being chosen according to the desired performance. The line of spots may cover, for example, a 30 mm strip of substrate surface, with the substrate W being for example 300 mm in diameter. A scanning motion of substrate table WT in the Y-direction is used to map surface levels along a stripe of the substrate before stepping to the next X-position. Because motion of the stage WT is linear during measurement, there are no acceleration forces to distort the table or substrate and disturb the measurements. On the other hand, the need to scan every Y-position before stepping in X makes the entire operation quite time-consuming, which mitigates against improving throughput of the lithographic apparatus as a whole. Level sensor projector LSP and detector LSD in the known apparatus are based on one of the embodiments described in U.S. Pat. No. 5,191,200 (van der Werf et al/Philips), mentioned above.

FIG. 3 illustrates the principles of triangulation employed in a level sensor of the type just described, and employed also in the embodiments of the present invention, described below. (The invention is not necessarily limited to this type of measurement, but it is a technique well-established in the art.) In FIG. 3(a) W represents the target substrate (wafer), and LZ represents a zero reference level of the level sensor. LSP and LSD indicate generally the position of the projector and detector of the level sensor, respectively. Imaging optics are omitted from this diagram for simplicity. Rays from the projector come into the diagram from the left and an image of the projector grating is formed in the plane labeled GP'. GP'r represents the reflection of the plane GP', which is the origin of the reflected rays emerging to the right hand side, towards detector LSD. Detector optics form a further image GP'' in the plane of a detector grating GD. A relative phase of the projected grating image and the detector grating can be measured by a photo-detector, whose output intensity will vary with the phase.

FIG. 3(b) illustrates the change caused when the target surface moves away (in this case below) from the zero level LZ. The rays are subjected to a longer path length, compared with the zero level path indicated by the dotted arrow. A height difference H can be measured by observing the change in intensity at the detector, caused by the offset in phase between the projected image GP'' of the projection grating and the detector grating GD. With appropriate design of the pitch of the detector and projector gratings in relation to the angle of incidence and the expected height variations, it is reasonably straightforward to obtain a monotonic intensity variation across the expected height range. If the variation in this operating range is monotonic but not sufficiently linear, a calibration can be applied to translate the measured intensity to a height measurement. The skilled person will appreciate that mechanisms must be provided for coarse positioning, to bring the target within this operating range. As will also be known, the stage height and/or detector height are controlled during scanning so as to minimize deviations from the zero level, by way of servo controllers. These movements are recorded as a component of the measured height signal, the height error indicated by the detector signals being added to this component to obtain the exact height at a given point.

FIG. 4(a) illustrates in more detail the focusing of individual lines within each grating spot at the substrate surface, in a hypothetical example where the grating is perpendicular to the optical axis of the lens of level sensing projector LSP. A focal plane of the level sensing projector is indicated by the image GP', which lies at an oblique angle to the surface of substrate W. Six pairs of rays are shown, each pair delimiting one line in the grating pattern. While six lines are shown for the sake of this illustration, typically the pattern will have a larger number of lines, for example 20-40. A heavy arrow labeled EF+ indicates positive defocus where the target surface for the uppermost line lies beyond the focal plane. Similarly, negative defocus is represented by arrow EF− on the lowest line. Broad lines along the line of the target surface show how the central line is relatively tightly focused on the surface, while the lines are smeared more broadly across the surface towards the extremities of the pattern. In summary, the image of the projection grating which is made on the target surface is out of focus, particularly at the extremities of the grating pattern.

A practical sensor can employ measures to avoid this varying defocus between lines. An existing technique for this is to tilt the grating relative to the optical axis, so that its focused image also becomes tilted, according to the well-known Scheimpflug condition.

FIG. 4(b) is a straightened diagram of the level sensor optical system from the plane of projection grating GP in the projector LSP at the left, through the projected image GP' reflected from the target (substrate W) in the centre, to the plane of the detection grating GD in the detector LSD. Level sensor projector LSP comprises grating GP and a projection lens system comprising a telecentric lens, in an embodiment, a double telecentric lens with unity magnification. In this simple illustration, a pair of lens elements is indicated by the bars with "+" signs, though multi-element lens groups can of course be used for higher performance. A lens element or group closest to the target is marked with an asterisk "*" and may be referred to as the 'front' element for convenience.

In FIG. 4(b), as in FIG. 4(a), a first group of rays represented by chain dotted lines with single dots represent one line of the grating pattern, while a group of rays with double dots represents another line of the grating. Three rays are shown in each group, representing diffraction orders admitted by the numerical aperture (NA) of the lens. The focusing of the grating lines can be seen in FIG. 4(b), where the rays of the single-dotted and double-dotted group respectively converge, in front or behind the plane of the target. Tilting of the grating to exploit the Scheimpflug condition is not shown, but would be used in practice, so that all lines within the grating spot are focused in the plane of the target substrate W.

Similarly, the level sensing detector LSD comprises the detection grating GD (and photo-detectors) as well as an optical system comprising a telecentric lens, typically identical to that in the projector. Again, a front element of the detector optical system is marked with an asterisk "*". As mentioned, in a practical system having the required accuracy, any of these lens elements may be a multi-element construction. The term "lens" should also be understood as including refractive (dioptric), reflective (catoptric) and hybrid (catadioptric) components. All these refinements and variations can be applied in the embodiments described below, according to the knowledge of the skilled reader. More details of practical systems and variants thereof can be found in U.S. Pat. No. 5,191,200, mentioned above. The details and variants can be adapted by the skilled reader for application in embodiments of the present invention, described below. The contents of U.S. Pat. No. 5,191,200 are therefore incorporated herein by reference, and provide background detail for understanding the basic principles and many optional features of a practical system.

The angle of incidence in an example system may be 15-20 degrees, for example 17 degrees to the target surface. Because of this shallow angle of incidence, features of projection grating GP will be stretched in the Y-direction. In an example, each "spot" in plane GP or GD may have an aspect ratio defined by the sine of the angle of incidence. For an angle of incidence of 6.4 degrees, the aspect ratio is approximately 1:9, in order to arrive at a square (1:1) on the target surface. For an angle of incidence around 15-20 degrees, typical for the embodiments described below, the aspect ratio is in the region of 1:3. The image plane at the target is labeled GP' and GD' indicating that, ideally, it is an image of both the projection grating GP and the detection grating GD. Also, the plane of detection grating GD is labeled GP", indicating that, again ideally, a second image corresponding to the projection grating should be formed in the same plane as the detection grating.

FIG. 5 illustrates the principle of the scanning level sensor in accordance with a first embodiment of the present invention. FIG. 5(a) shows the objective lens elements of the projector and detector LSP, LSD respectively, with the substrate W at centre. Prior to the front lens element, and in the focal plane of that element, projector LSP includes a moving optical element, in this example a mirror MP which oscillates in angle over time, with a frequency between a few hertz and a few tens of hertz. As mirror MP oscillates between different angles δθ, the optical path of the level sensing spot moves between extreme positions indicated by the dotted and dashed rays respectively. At its central position, the path of the ray containing each level sensing spot is shown in solid lines. Within each of these rays, it should be recalled, there is the grating pattern illustrated in more detail in FIGS. 3 and 4. The three rays do not indicate diffraction orders within a grating line, nor even three lines within the grating spot. Rather they indicate different scanning positions of the entire spot. At the detector side, a complementary oscillating mirror MD moves synchronously with mirror MP, in anti-phase. This is illustrated by the angle −δθ. Consequently, when the novel projector and detector LSP, LSD are substituted for projector LSP and LSD in the apparatus shown in FIG. 2, an entire stripe of the substrate W can be scanned without relative movement between the substrate and the detector in the Y-direction. The length of this strip is indicated by δY in the diagram, and, in particular embodiments, covers the entire diameter of the wafer (typically 300 mm).

The optical system is designed to maintain constant the angle of incidence of the rays, across the range δY. This avoids process dependent variations in the height values measured across the target. As for the known detector, the optical system at the projector and/or detector side of the apparatus may include a tilted grating element, thereby to tilt the projected grating image GP' parallel with the plane of the target.

In FIG. 5(b), the optical paths of the ray groups representing the level sensor spot in its central position (solid lines), and the first and second extreme positions (dotted and dashed respectively) are illustrated passing through the various elements of the optical system, with parts labeled similarly to the corresponding parts in FIG. 4(b). The oscillating mirrors MP and MD are indicated within the optical system of the projector and detector respectively. Details of the consequences and measures involved in operation of the level sensor accurately without relative movement of the target will be discussed further below.

FIG. 6 illustrates movement of the rays for each individual spot in the objective lens L* of the level sensing projector LSP in two different types of scanning movement that may be implemented. A similar situation applies in the lens of the level sensing detector LSD. In FIG. 6(a), the circle represents the objective lens L*. G'i indicates one spot of several (in the example, seven) spots which are spaced in the X-direction, and which measure, in parallel, the height of seven points on the substrate. Arrows δY' indicate the oscillating track of each spot, which covers substantially the area of the lens. A dotted ellipse indicates that only a central area would be used in the known level sensor, in which scanning of the target is made by movement of the target relative to the sensor.

In FIG. 6(a), and in the examples to be described below, each spot scans only in one direction, Y. In FIG. 6(b), there is shown the track of a single grating spot G', which follows a scanning path δXY' in two dimensions. In either case, the diameter of lens L* might be, for example, several centimeters, with the width of the pattern being, for example 30 mm, corresponding to a 30 mm wide stripe on the target substrate W. As already explained, because of the oblique angle of incidence in the Y-direction, the rectangular spots G' and G'i are transformed into square sensing areas when they impinge upon the target. The layout of the spots on the target surface is the same as seen in the diagram, but stretched in the Y-direction to cover a stripe on the order of 30 mm by 300 mm.

In summary, a low frequency optical scanning of the level sensing spot array is proposed for covering a large area, in particular embodiments the entire area, of the target substrate, without relative movement of the substrate and level sensing device. Additional high frequency modulations of low amplitude may be imposed on the mirror track, in the first direction or in a second direction, for noise suppression. A vibrating mirror for this latter purpose is disclosed, for example in U.S. Pat. No. 5,448,332 (Nikon).

A consequence of adopting the scanning movement illustrated in FIG. 6, compared with using a fixed portion of the lens illustrated by the dotted ellipse is not only to impose additional performance requirements on the design of the optical system including lens L*, but also has the consequence that height measurements made at different points on the target are now made via different points on the lens. Accordingly, the physical movement of the level sensing spot over the lens, as a function of the position on the wafer, effectively introduces a "fingerprint" on the height map, according to the variation of aberration over the lens. This additional fingerprint can be addressed by minimizing it through design and quality control and for measuring and subtracting it before reporting the height map for use in the exposure of a substrate. Suitable calibration processes can be designed.

FIG. 7 illustrates schematically an example of the drive mechanism for the oscillating mirrors MP and MD. The mirror is mounted, in this example, for one dimensional pivoting about a pivot point 201 defined by a support 202 within the level sensing apparatus housing (not shown). An actuator 204 drives the mirror to different angles $\delta\theta$ under control of a control unit 206. The actuator may for example be a piezoelectric motor or an electromagnetic actuator such as a 'voice coil'. The frequency f and the phase $\phi$ of the movement are controlled to achieve the desired scanning. An incoming ray 208 from a source and first part of the level sensing optical system impinges on mirror MP. The outgoing rays are shown, varying in angle by an amount $2\delta\theta$, in accordance with well known laws of reflection. At the detector side, a similar arrangement (not shown) is provided to drive mirror MD, the difference being that the incoming rays are at varying angles, and the outgoing ray, following a path similar to ray 208, impinges always at the same point on a detector grating. In principle, the detector side and projector side optical systems could be different, but it is easier in practice to use a symmetrical arrangement, as described in this example.

The oscillation in $\delta\theta$ is controlled by a waveform of the type illustrated in FIG. 7(b), which is not sinusoidal, but rather has linear sections indicated by solid lines, and reversing sections which are outside the measurement range of the sensor. As an alternative, it may be useful to use a non-linear scanning (for example, sinusoidal) signal, and use more elaborate data acquisition timing and/or data processing to apply mathematical transformations required to obtain a height map with sample points in the desired grid.

In order to maintain the projection mirror MP and the detection mirror MD oscillating perfectly in synchronism, a simple servo mechanism can be implemented by reference to the height signals measured by the level sensor. Specifically, any phase error between the mirror movements will result in a variation in the height of the target surface as reported by the detector LSD. Since, from control of the substrate table WT, it can be known that the height H of the target surface is not in fact changing, any time-varying component dH/dt of the height reported for a specific point on the wafer, indicates a phase error which can be corrected by controller 206, working together with the corresponding controller of the detector mirror MD.

During two-dimensional scanning motion, control of the second axis will require additional actuators and additional frequency/phase control, but the principles remain the same. Scanning movement need not be by oscillating mirrors, but could, for example, be by a multi-faceted rotating mirror, prism or the like, to implement a raster pattern, rather than back-and-forth oscillation. Problems of synchronism between two moving optical elements can be avoided in alternative embodiments, mentioned briefly at the end of this description, in which the projector and detector are located behind a common objective lens, and the optical system at the "far side" of the target includes a "catseye" type retro-reflective element. Incoming and outgoing rays can be separated by a beam splitter so that the projection grating and detection grating/photo-detector are in the same housing. As there may be only one moving optical element, the problem of synchronization is avoided. For simplicity, the present description will assume that the projector LSP and detector LSD are located separately at opposite sides of the target region.

Another alternative to having two synchronized moving elements is to provide a fixed detector, having a linear height sensing range large enough to accommodate movements of the reflected image. The resulting height modulation can be known and subtracted mathematically before outputting a height signal. Such a technique obviously places greater demands on the linear range of the detector. Nevertheless, these operations are available to be considered when designing a practical implementation of the invention.

Figure 8:
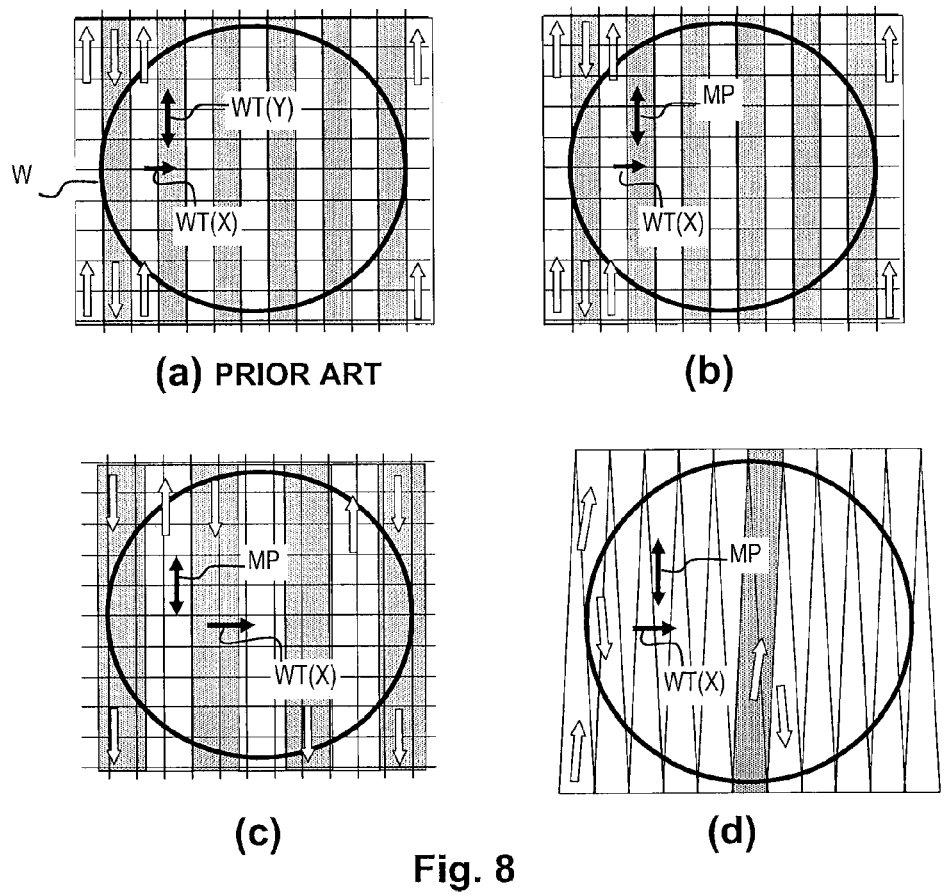
FIG. 8 illustrates alternative scanning patterns that may be implemented in the known level sensor (a) and in the novel level sensors (b), (c) and (d)

FIG. 8 illustrates in versions (a) to (d) the forms of various scanning patterns that may be implemented to cover a target substrate W. The bold circle represents the area of substrate W. FIG. 8(a) illustrates the known apparatus of FIG. 2, in which scanning in the Y-direction is performed by moving the substrate support WT beneath the sensors, and stripes corresponding in width to the field areas (target portions C) are measured, stepping in the X-direction between stripes. Alternate stripes covered by the sensor are shaded, with open arrows indicating the path of the level sensing spot array across the substrate. FIG. 8(b) indicates that the identical scanning pattern can be implemented in the novel apparatus by stepping the substrate support WT in the X-direction, while scanning using the moving mirrors in the Y-direction. While the resulting measurements may be the same, so that the wafer height map may be used in an identical manner to the wafer height map in the existing apparatus, the time taken to measure the complete substrate can be on the order of 1 second, rather than several seconds taken in the known apparatus. As discussed further below, each stripe may be scanned multiple times by the novel sensor to improve accuracy, in which case the open arrows shown might all point in the same direction, rather than alternating directions. Such details of implementation can be readily worked out by the skilled reader.

FIGS. 8(c) and (d) show further variations that may be applied in the novel apparatus, though the version (b) may have a tendency to be more simple and compatible with existing apparatus as a whole. In FIG. 8(c), the full width of the level sensing spot array is used to cover the wafer in fewer steps than are required in (a) and (b). Specifically, the information for each stripe may cover an area that is not limited to one column of target portions (fields). As an example, a 300 mm diameter wafer may then be covered in only 10 passes of a spot array 30 mm wide. While this improves the speed of the level sensing measurement, it imposes complications on the use of the resulting height map, which needs to be translated and possibly interpolated and corrected with suitable calibration, to provide consistent data in each scan of the exposure operation.

FIG. 8(d) illustrates a further modification in which the X-direction movement of the substrate table WT is continuous rather than step wise. The consequence of this is that the track of the level sensing spot array across the target is at an oblique angle to the columns of fields to be exposed on the wafer. This can further reduce the time taken for the measurement, while further complicating the mathematical transformations required to obtain a field-aligned height map from the height samples measured along oblique tracks.

In all of the examples illustrated, control of the level sensors scanning frequency and the substrate table scanning, or stepping movements yields many options for multi-pass scanning of a particular point on the target. Multiple measurements help reduce noise. In the examples (b) and (c), multiple passes over the same stripe may be implemented before stepping in X-direction, or steps in the X-direction may be shorter than the width of the spot array, so that strips overlap and each point on the wafer is measured twice or more. Similarly in mode (d), the scanning speed of substrate support WT in the X-direction may be matched to provide two passes at each location, as shown, or may be reduced to provide more passes.

Figure 9:
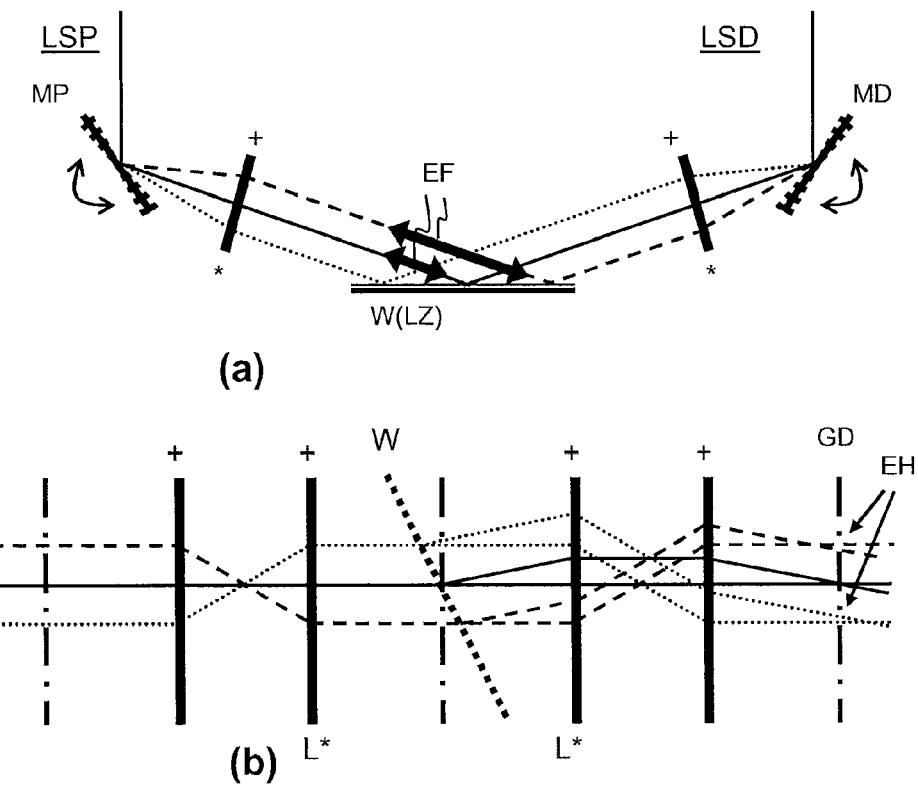
FIG. 9 illustrates focus issues arising in the scanning level sensor of FIGS. 5 to 7.

FIG. 9 illustrates the discussion of some issues to do with defocusing of the level sensing spot on the target. FIG. 9(a) shows the target surface at the LZ (level sensing zero) position between level sensing projector LSP and detector LSD. The Y-scanning range of one spot is shown again by the extreme dotted and dashed ray paths. FIG. 9(b) shows the same optical system with the reflection removed. Substrate W may be generally at the level sensing zero height, but tilted about the X-axis and this introduces a non-uniformity of focus across the Y-direction, represented by the focus error EF illustrated on two of the rays on (a). One consequence of this defocus is that the blurring of the level sensing spot will cause a spot coverage variation over Y, which is undesirable. More importantly, and as illustrated in FIG. 9(b), a tilted wafer results in a height error EH which varies across the target in the Y-direction. The effect of a tilted target W is illustrated in exaggerated form, showing how the solid, dotted and dashed ray paths deviate from the nominal paths shown, for example, in FIG. 5. Assuming that the central ray is properly focused on the tilted target surface, the optical system of the detector LSD manages to bring the central ray path back to the correct point in the detection grating plane GD. The dotted and dashed ray paths, on the other hand, are out of focus in opposite directions where they are reflected from the tilted target surface, and consequently arrive at changed locations on the detection grid in plane GD. This is interpreted by the detector as height change, causing a measurement error.

Consequently, in order for the level sensing results to be insensitive to tilt of the wafer which arises in practice, focus variations with tilt should be eliminated or reduced in the design of the system. One source of focus variation across the target can be variation in optical path length between ray paths at different points in the scan. As can readily be seen from the diagrams, the path length difference between the lens and the near and far extremes of the wafer is of the order of the wafer diameter, typically 300 mm. There is also a difference in path length between the moving optical element (mirror MP/MD) and the lens L*, though this can be minimized by maximizing the distance between these elements, and so minimizing the scanning angle.

Figures 10, 11:
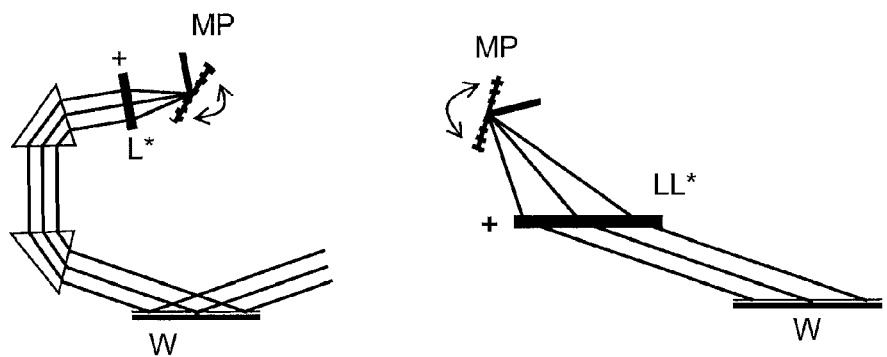
FIGS. 10 and 11 illustrate alternative path length equalization measures that may be applied in embodiments of the invention.

FIG. 10 illustrates a first approach to equalizing path lengths between the rays during scanning of the level sensor. The path between the lens and target W is not direct, but guided by a pair of prisms. The number of prisms does not have to be two. The relative difference in path length may need to be of the order of the scan length (300 mm), as explained above. This involves not only a rather large and expensive construction, but also additional aberrations, and therefore process dependency variations over the wafer. The same would be required at both projection and detection site.

FIG. 11 illustrates another approach in which a lens LL* having an aperture comparable to the dimension of the target itself is provided, which in practice could comprise a micro-lens array. Each element of the micro-lens array would correspond to one sampling point in the course of the scan. Challenges would arise in the shape stability of the lens and variation in process dependency across the wafer (process dependency generally refers to the sensitivity of measurements to the microscopic features, resist layers, product patterns etc. which are present on the target substrate). While the approaches shown in FIGS. 10 and 11 are theoretically available, each has practical consequences and costs in space and/or expense, which make them less attractive than the solutions presented further below. The designer of a practical system can choose to use them if desired, however.

Figure 12:
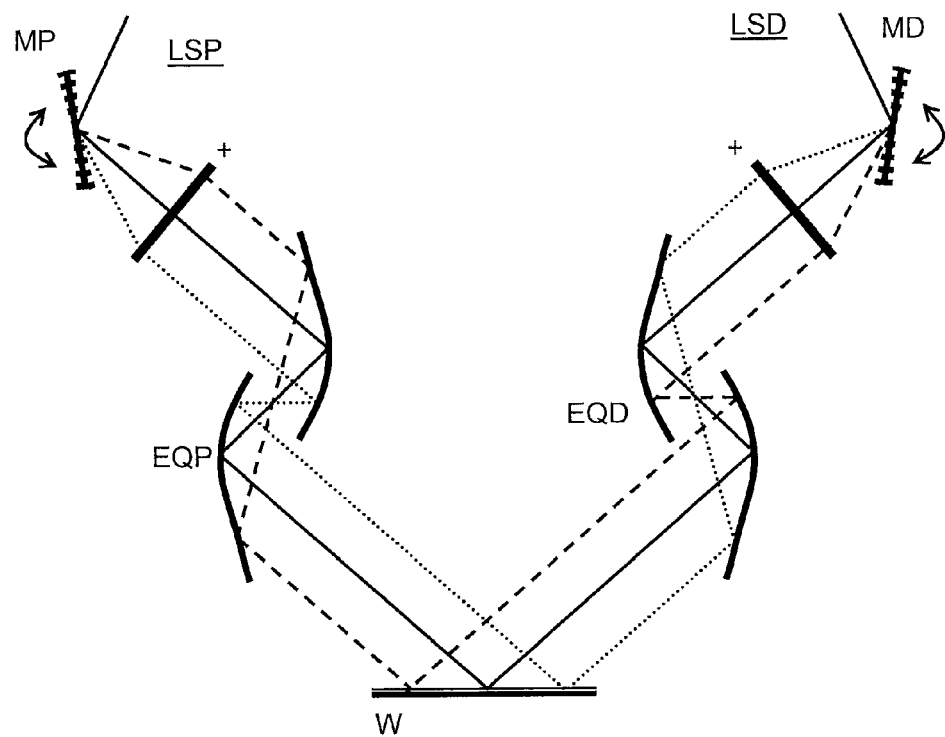
FIG. 12 illustrates a further path length equalization arrangement according to a further embodiment.

FIG. 12 illustrates a modified system of the type generally shown in FIGS. 5 to 7, modified with the inclusion of a more practical form of path length equalizer EQP, EQD at the projector and detector side, respectively. Each path length equalizer comprises a pair of shaped reflectors (mirrors) of the general form shown, designed so as to eliminate (or at least reduce the occurrence of) focus variation across the target, and thereby reduce tilt sensitivity in the measured target height. The mirrors may be separated by space (air or vacuum), or may be opposite sides of a solid optical element. Equalizers EQP, EQD are shown in this instance between the respective objective lenses of the projector and detector and the target, equalizing the path length as a function of position on the target. In an alternative construction, equalizers could be placed between the moving mirrors and the lenses, equalizing path length as a function of angle.

Figure 13:
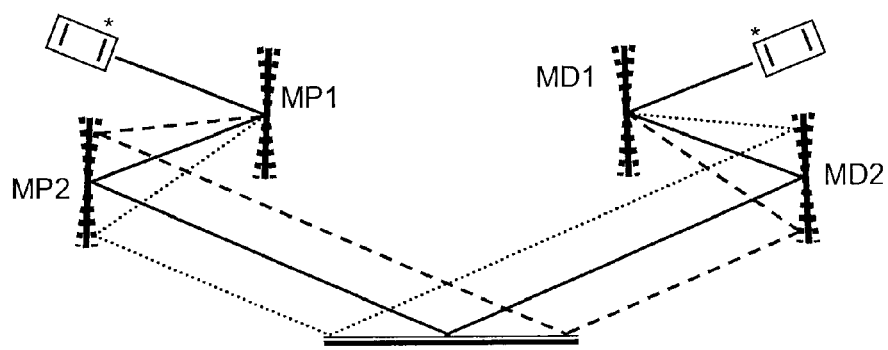
FIG. 13 illustrates a further path length equalization arrangement according to a yet further embodiment.

FIG. 13 shows a further alternative that may be considered instead of shaped reflectors. Here instead of a single moving element at the projector and detector side, the projector comprises two moving mirrors MP1, MP2 which are matched by mirrors MD1 and MD2 at the detector side. Controlling the amplitude of oscillations of added the mirrors MP2 and MD2 offers the potential to eliminate focus error in the same manner as the shaped mirrors of equalizers EQP, EQD in FIG. 12.

Note that the use of two wobbling mirrors to equalize path length while steering the beam for scanning eliminates the need for the mirror to be located in the focal plane of lens L*, that is between elements of the projection/detection lens system. This allows the use of self-contained projection and detection lens systems such as double telecentric lenses, without modification to accommodate the moving elements and convoluted ray paths. This simplification of the projection/detection lens systems reduces cost and may compensate the additional complexity of synchronizing further mirrors. The moving elements can be located between the projection/detection grating and its respective lens system. Alternatively, and as shown schematically in FIG. 13, the moving elements can be placed in the optical path between the projection/detection lens system and the substrate.

In order to moderate the path differences that must be equalized across the scan, measures should be taken, for example, to maximize the distance between the moving element MP/MD and the lens. This will both limit the required wobbling angle δζ and simplify whatever corrective measures are required.

U.S. Pat. No. 5,013,108 (Van Amstel/Phillips) describes examples of optical scanning (by rotating polygon) and pathlength equalization by multiple curved mirrors. This document accordingly can be used to provide guidance in the design of the embodiment of FIG. 12. In all of the embodiments described above, the profile of mirror angle over time may be non-linear or non-sinusoidal, for one or all of the mirrors, in order to simplify data acquisition or processing. Any of the moving mirrors or other moving optical elements could in principle be shaped (curved in one or two dimensions) instead of planar, to achieve a desired path variation against mirror tilt angle. Similarly, movements of these elements are not limited to tilting, and may be linear or compound movements.

Figure 16:
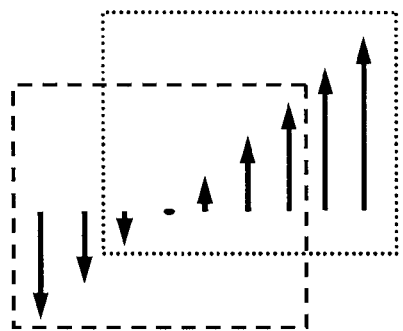
FIG. 16 further illustrates the discussion of errors caused by local tilting of the target surface.

Some refinements of the method will now be described, with theoretical background illustrated by FIGS. 14 to 16.

Firstly it is noted that the performance of the level sensor is potentially degraded if the target is not generally at the designed zero level LZ. FIG. 14 illustrates a situation where the target W is displaced from level LZ, in that the image GP" of the projection grating in the region of the target and the image GD' of the detection grating in the region of the target are no longer coincident. Consequently the detected image GP'" of the projection grating at the detector side is not coincident with the plane GD of the detector grating itself. In other words, the deviation of the reflecting target from level sensor zero LZ causes defocus of the projected grating on the target and on the detection grating. As in the illustration of FIG. 4, single and double chain dotted lines illustrate the positions of respective grating lines within one spot position, and do not represent the scanning motion of the spot pattern of the whole. The first diffraction orders are displaced through this defocus, which also causes dependency of the measured height on wafer process features.

In order to minimize deviation from zero level, and to make the best use of the linear range of the level sensor, servo mechanisms are conventionally employed to control the sensor height and/or the substrate table height during level sensing, as mentioned already above. This provides a first approach to minimize the defocus efforts situation illustrated in FIG. 14.

Multiple scans of the same target location may be performed, averaging the results to obtain height measurements with reduced low-frequency noise. As a further measure, it is proposed herein to use at least two scans in succession, of which the second one will follow the zero level with improved accuracy. Specifically, on the first scan, height variations including servo movements and residual differences measured by the level sensor are recorded. Prior to the second scan, the measured height profile is applied as a height set point profile for the Z axis servo control of the substrate table during that scan. Consequently, tracking of the zero level can be greatly improved on the second pass, both in terms of "scan in" after encountering the edge of the wafer, and in subsequent tracking height variations that are effectively anticipated, rather than merely reacted to by the servo control. Consequently, the height values obtained in the second scan should be more accurate than would be obtained on a first scan. There will still be height variations between individual spots Gi in a multi-spot array, of course. The height of the target can be controlled so that the average of these variations is as close to zero as possible. The same principle can be applied between scans, using the height profile measured in one scan as a predictor of the height profile to be measured in a subsequent scan.

FIG. 15 illustrates the impact of local tilt on the target surface about the x-axis (Rx) by which we mean a surface shape showing tilt on the scale of each spot or grating line only. FIG. 15(a) illustrates the effect of local tilt on the scale of one grating line, in the case where the target is nevertheless located at the zero level LZ. Although the chain dotted rays representing two bars now follow a different path from the path they would follow when deflected from a flat target (shown in the dashed lines) they nevertheless converge at the correct point in the plane GD of the detector grating.

By contrast, in FIG. 15(b), we see the consequence of local wafer tilt on the dimension of a whole level scanning spot (grating). Again, the ray paths without local tilt are shown in dashed lines, while the effect of tilt is shown on the chain-dotted rays representing respective bars. The effects are exaggerated, of course, for the sake of illustration. We see that the target plane at the centre of the diagram is tilted uniformly across the spot pattern, causing a difference in focus between bars. The image represented by the focusing of the rays of each bar in the detection grating plane at the right hand side shows that they have moved apart as indicated by the arrows, namely the pattern is magnified at the detector plane GD as a result of the local wafer tilt. This magnification is already present at the target level, in the centre. Inspection and analysis reveals that the magnification not only depends on the wafer tilt, but also on the defocus of the projection grating GP on the target. The effect shown in the diagram is only the magnifying effect, and not the "proper" shift in the grating pattern caused by triangulation of any 'real' height variation which is a consequence of wafer tilt.

As illustrated in FIG. 15(b), therefore, wafer tilt Rx tilts the image of the projection grating on the detection grating and causes effectively a magnification of the projection grating image. This causes non-uniform variation of the intensity of each bar, as detected on the grating. FIG. 16 shows the consequences of this tilt, across a number of grating lines. At least at first order, grating lines to the left in the diagram have progressively increasing negative height error, while grating lines to the right in the diagram have progressively increasing positive height error. These errors are averaged by the detector, and do not necessarily lead to an error in height measurement. This average depends critically on focus of the level sensing spot on the wafer, however, as illustrated by the dashed rectangle and the dotted rectangle in FIG. 16. The dashed rectangle represents the in-focus situation where the magnification illustrated in FIG. 15(b) causes half of the detected grating lines to be moved upwards and half to be moved downwards. The overall effect on the height measurement in that case is zero. In the case where the spot is not well focused and a local tilt is encountered, the balance of upward and downward errors will be unequal, as illustrated by the dotted rectangle. In this case, the presence of tilt will cause an error in the reported height measurement.

Maintaining good focus is therefore important to an accurate height measurement, and the double-pass servo mechanism described above can be used to mitigate local tilt effects.

As mentioned, FIG. 15(a) illustrates first order effects. Similar considerations apply for third, fifth etc order variations (odd numbered orders) in the local wafer shape. Even orders, such as second, fourth, sixth order variations in the local wafer shape will not cancel in the manner illustrated in FIG. 16, and can result in a height measurement error, known as and a "curved wafer effect". These offsets are independent of defocus.

Figure 17:
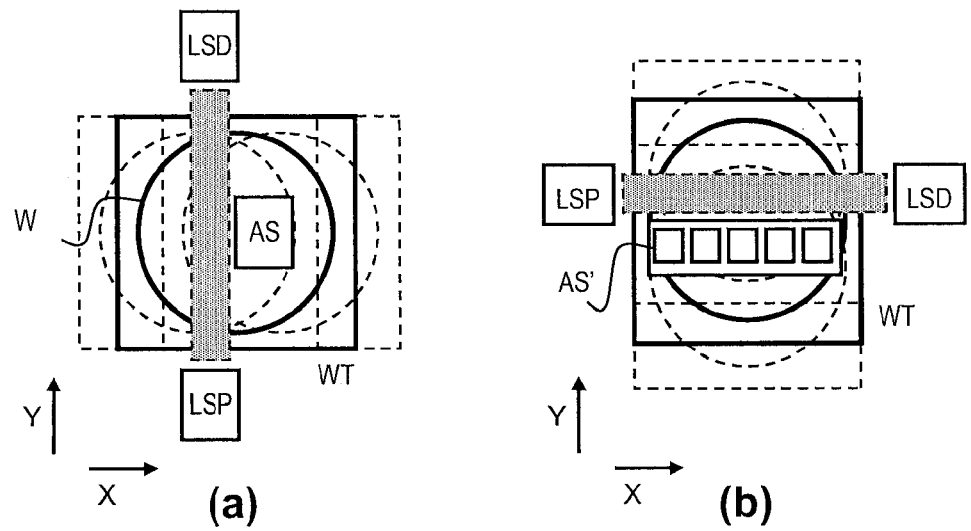
FIG. 17 illustrates alternative layouts for the scanning level sensor in different types of lithographic apparatus.

FIG. 17 illustrates application layouts for the novel level sensor in different types of lithography apparatus. In the apparatus at FIG. 17(a), substrate support WT carrying the target substrate W steps or scans in the X-direction, while level sensing projector and detector LSP and LSD scan strips in the Y-direction. An alignment sensor AS is provided for picking up X- and Y-position information from alignment marks present on the target and/or the substrate table. Depending on the form of the alignment sensor, scanning motions of the substrate table WT in both X- and Y-directions may be necessary.

FIG. 17(b) illustrates an alternative layout, in which the level sensor LSP, LSD is arranged to scan strips oriented in the X-direction, while the substrate table scans or steps in the Y-direction. The alignment sensor AS is replaced by an array of alignment sensors AS' which are spaced in the X-direction so as to measure alignment marks spaced across the substrate in a parallel operation. In this manner, level sensing and alignment can be performed in parallel in a reduced time. It will be understood that, for the arrangement (b), references to X and Y directions in the description of the level sensor embodiments above should be reversed. Otherwise, the principles of operation and the details of implementation can be substantially the same.

Figure 18:
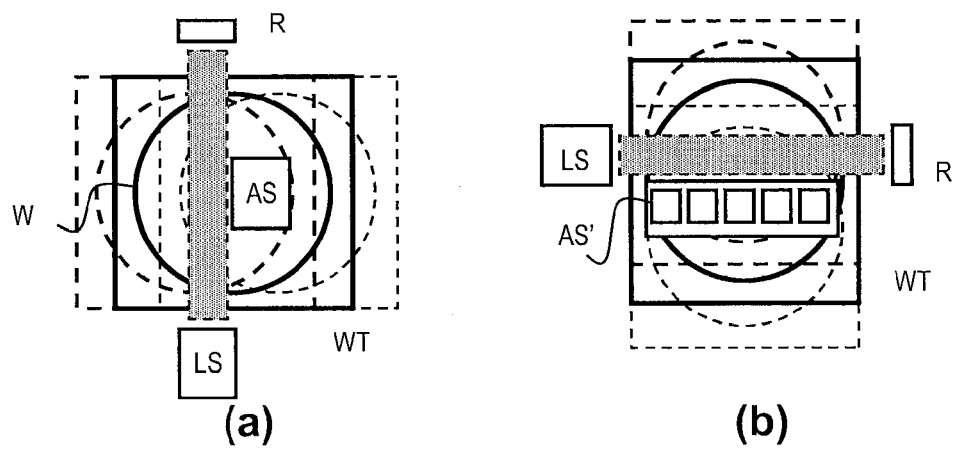
FIG. 18 illustrates layouts of alternative embodiments of the scanning level sensor employing retro-reflective optics.

FIG. 18 illustrates similar examples to FIGS. 17(a) and (b), with the modification that the optical system at the detector side is replaced by a reflection unit R, incorporating a catseye as mentioned above, and the projection and detection are both located in a single unit labeled LS. Each grating spot in this case will be reflected twice from the target surface before reaching the detection grid GD.

Figure 19:
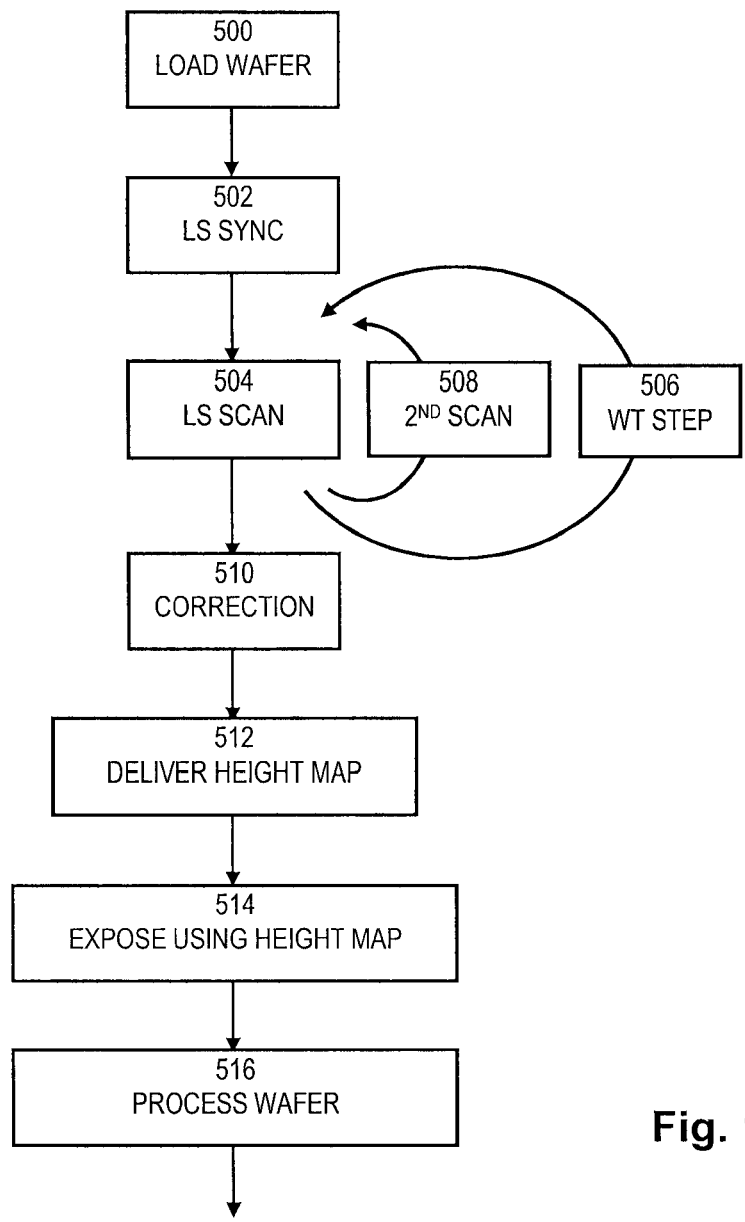
FIG. 19 illustrates a level sensing and product manufacturing process using the scanning level sensors of FIGS. 5-18.

FIG. 19 provides an overview of the level scanning process. At 500 a substrate (wafer etc) is loaded into a lithography apparatus. At 502 the level sensing apparatus with moving optical elements is started and, where required, synchronization between the elements is achieved as described above. At 504 a stripe of the target is presented and scanned by the moving spot or spot array. At 506 the substrate table is stepped in the direction perpendicular to the scanning stripe, and/or is subject to continuous scanning movement in said direction, and the scan of the next stripe is performed by a repeat of step 504. Optionally as described above, step 508 may involve setting height setpoint profile and/or other servo parameters of the level sensors and performing a second scan with increased accuracy and reduced sensitivity to wafer tilt etc. The second scan may be of the same stripe, in which case no movement in the X direction is made between the first and second scan. Alternatively, the measured height profile may be used to improve scanning in an overlapping stripe or a neighboring but non-overlapping stripe. Depending on the shape of the wafer and the scale of each measurement, measurements made in a neighboring stripe may serve as a good predictor of the profile in a current stripe. This predictor can be used as a reference to adjust the height setpoint profile of the sensor when scanning the current stripe. The measurement of a neighboring stripe can in particularly be useful as a predictor to reduce height servo errors in the 'scan in' phase at the beginning of a current scan.

At 510 any corrections such as for lens aberrations (FIG. 6) are applied, prior to delivering the finished height map at 512. While the steps 504, 510, 512 are shown sequentially, all or part of the corrections may be during the scanning measurements. The height map may be delivered in one go to a controller for the subsequent exposure operation, or it may be provided as a stream, while scanning is still in progress. At 514 the product patterns from patterning device MA (FIG. 1) are exposed onto the target portions C (fields) of substrate W, using the height map obtained from the level sensor to maximize focus accuracy of the projected pattern at every portion and, in the case of a scanning exposure, during exposure of each portion. At 516, the exposed substrate is processed in a well-known manner to create actual product features on the substrate. The entire process may be repeated to produce a multi-layer device, as is well know.

By use of the improved level sensor, finer product patterns and greater consistency of product properties are achieved alternatively or in addition, the same quality of product may be achieved with greater throughput, through the reduction in level sensing measurement time afforded by the scanning level sensor.

Figure 20:
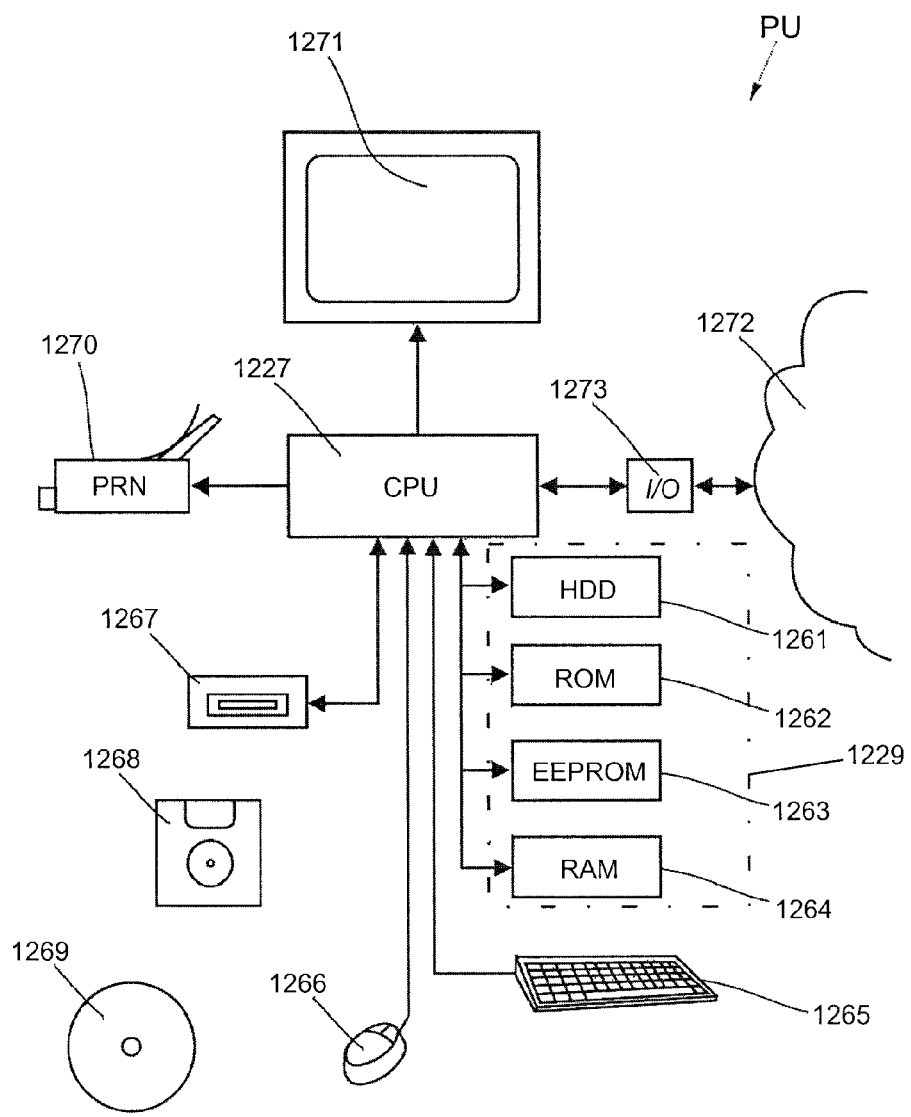
FIG. 20 illustrates components of a processing unit employed in the lithographic apparatus for controlling the level sensing operation and other functions.

It should be understood that the processing unit PU in the previous embodiments may be a computer assembly as shown in FIG. 20. The computer assembly may be a dedicated computer in the form of a control unit in embodiments of the assembly according to the invention or, alternatively, be a central computer controlling the lithographic projection apparatus. The computer assembly may be arranged for loading a computer program product comprising computer executable code. This may enable the computer assembly, when the computer program product is downloaded, to control aforementioned uses of a lithographic apparatus with level sensing by optical scanning, in accordance with the steps 502-512 of the method described above.

Memory 1229 connected to processor 1227 may comprise a number of memory components like a hard disk 1231, Read Only Memory (ROM) 1262, Electrically Erasable Programmable Read Only Memory (EEPROM) 1263 en Random Access Memory (RAM) 1264. Not all aforementioned memory components need to be present. Furthermore, it is not essential that aforementioned memory components are physically in close proximity to the processor 1227 or to each other. They may be located at a distance away The processor 1227 may also be connected to some kind of user interface, for instance a keyboard 1265 or a mouse 1266. A touch screen, track ball, speech converter or other interfaces that are known to persons skilled in the art may also be used.

The processor 1227 may be connected to a reading unit 1267, which is arranged to read data, e.g. in the form of computer executable code, from and under some circumstances store data on a data carrier, like a floppy disc 1268 or a CDROM 1269. Also DVD's or other data carriers known to persons skilled in the art may be used.

The processor 1227 may also be connected to a printer 1270 to print out output data on paper as well as to a display 1271, for instance a monitor or LCD (Liquid Crystal Display), of any other type of display known to a person skilled in the art.

The processor 1227 may be connected to a communications network 1272, for instance a public switched telephone network (PSTN), a local area network (LAN), a wide area network (WAN) etc., by way of transmitters/receivers 1273 responsible for input/output (I/O). The processor 1227 may be arranged to communicate with other communication systems via the communications network 1272. In an embodiment of the invention external computers (not shown), for instance personal computers of operators, can log into the processor 1227 via the communications network 1272.

The processor 1227 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 1227 may even be located a distance away of the other processing units and communicate via communications network 1272.

It is observed that, although all connections in FIG. 20 are shown as physical connections, one or more of these connections can be made wireless. They are only intended to show that "connected" units are arranged to communicate with one another in someway. The computer system can be any signal processing system with analogue and/or digital and/or software technology arranged to perform the functions discussed here.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the teen substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, modifications of the invention may take the form of a computer program containing one or more sequences of machine-readable instructions describing a method as disclosed above, or a data storage medium (e.g. semiconductor memory, magnetic or optical disk) having such a computer program stored therein.

The invention claimed is:

1. A lithographic apparatus comprising:
   a patterning subsystem for transferring a pattern from a patterning device onto a substrate, the patterning subsystem being controlled in accordance with measurements of level variations across a surface of the substrate;
   a level sensor for projecting a patterned level sensing beam of radiation to reflect from a location on the substrate surface and for detecting the reflected sensing beam to record a height of the surface level at said location, wherein said level sensor incorporates at least one moving optical element and whereby said level sensor is arranged for optically scanning the substrate surface by the level sensing beam in at least one dimension to obtain measurements of the height of the surface level at different locations without corresponding mechanical movement between the level sensor and the substrate; and
   a focus control arrangement for maintaining focus of said patterned beam on said substrate during said level sensing beam scan as an indication of focus error;
   wherein said focus control arrangement is responsive to height variations measured during at least one previous sensing beam scan as a predictor of focus error in a current level sensing scan of the level sensing beam of radiation.

2. An apparatus as claimed in claim 1 wherein the scanning of said level sensing beam extends in said one dimension across the entire substrate, and the substrate and the level sensor are, arranged to move relative to one another in a second dimension to complete measurements of surface level variations in two dimensions.

3. An apparatus as claimed in claim 1 wherein said level sensor further includes at least one path length equalization optical arrangement configured to reduce variation of optical path length of said beam to the substrate surface during said sensing beam scan.

4. An apparatus as claimed claim 1 wherein said moving optical element is positioned between elements of a lens system which projects the level sensing beam onto said substrate.

5. An apparatus as claimed in claim 1 wherein the level sensor includes at least two moving optical elements, movements of the elements being synchronized with one another.

6. An apparatus as claimed in claim 5 wherein a first moving optical element steers the level sensing beam onto a target location moving across the substrate surface and a second moving optical element steers the level sensing beam reflected from said moving target location to a stationary detector.

7. An apparatus as claimed in claim 5 wherein at least two moving optical elements are positioned in series between a source of said level sensing beam and said substrate, said elements moving synchronously to steer said beam onto a target location moving across the substrate while minimizing optical path length variation.

8. An apparatus as claimed in claim 7 further comprising a projection lens system which projects the level sensing beam onto said substrate, wherein neither of said two moving optical elements is positioned between elements of said projection lens system.

9. An apparatus as claimed in claim 1 wherein said level sensing beam follows a path in which it is reflected twice from said substrate surface and twice from said at least one moving optical element between the projecting and the detecting for each height measurement.

10. An apparatus as claimed in claim 1 further comprising an optical projection system that is configured and arrange to transfer the pattern from the patterning device to the substrate in an exposure step, the apparatus further being responsive to the substrate height variations measured by the level sensor in a prior measurement step in order to maintain focus of the projected pattern at a target portion of the substrate.

11. A method of measuring level variations across a surface of substrate in a lithographic apparatus, the method comprising:
   using a level sensing optical system to project a level sensing beam of radiation to reflect from a location on the substrate surface; and
   detecting the reflected sensing beam to record a height of the surface level at said location,
   wherein the optical system employs at least one moving optical element whereby said sensing beam scans different locations across the substrate surface by optical movement in at least one dimension, and the detecting obtains respective measurements of the height of the surface level at said different locations without corresponding mechanical movement between said level sensing optical system and the substrate; and
   wherein said level sensing beam is a patterned beam, the method including focusing said patterned level sensing beam on said substrate by reference to height variations measured during said optical scanning as an indication of focus error, wherein said focusing is performed by reference also to level variations measured during at least one previous scan as a predictor of focus error in a current level sensing scan of the level sensing beam of radiation.

12. A method as claimed in claim 11 wherein the optical scanning of said sensing beam extends in said one dimension across the entire substrate, the substrate and level sensing optical system being moved relative to one another in a second dimension direction to complete measurements of surface level variations in two dimensions across the substrate.

* * * * *